(12) United States Patent
Chen et al.

(10) Patent No.: US 11,380,611 B2
(45) Date of Patent: Jul. 5, 2022

(54) CHIP-ON-WAFER STRUCTURE WITH CHIPLET INTERPOSER

(71) Applicant: Taiwan Semiconductor Manufacturing Co., Ltd., Hsinchu (TW)

(72) Inventors: Weiming Chris Chen, Taipei (TW); Kuo-Chiang Ting, Hsinchu (TW); Shang-Yun Hou, Jubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/919,298

(22) Filed: Jul. 2, 2020

(65) Prior Publication Data
US 2021/0305146 A1 Sep. 30, 2021

Related U.S. Application Data

(60) Provisional application No. 63/001,894, filed on Mar. 30, 2020.

(51) Int. Cl.
| | | |
|---|---|---|
| *H01L 23/498* | (2006.01) | |
| *H01L 23/31* | (2006.01) | |
| *H01L 21/48* | (2006.01) | |
| *H01L 21/56* | (2006.01) | |
| *H01L 23/538* | (2006.01) | |

(52) U.S. Cl.
CPC ...... *H01L 23/49861* (2013.01); *H01L 21/486* (2013.01); *H01L 21/56* (2013.01); *H01L 23/3121* (2013.01); *H01L 23/5384* (2013.01)

(58) Field of Classification Search
CPC ......... H01L 23/49827; H01L 23/49861; H01L 21/486; H01L 21/56
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |

(Continued)

FOREIGN PATENT DOCUMENTS

| | | |
|---|---|---|
| KR | 20140065282 A | 5/2014 |
| KR | 20150120570 A | 10/2015 |

*Primary Examiner* — Jaehwan Oh
*Assistant Examiner* — John M Parker
(74) *Attorney, Agent, or Firm* — Slater Matsil, LLP

(57) ABSTRACT

A method of forming a semiconductor structure includes bonding a first die and a second die to a first side of a first interposer and to a first side of a second interposer, respectively, where the first interposer is laterally adjacent to the second interposer; encapsulating the first interposer and the second interposer with a first molding material; forming a first recess in a second side of the first interposer opposing the first side of the first interposer; forming a second recess in a second side of the second interposer opposing the first side of the second interposer; and filling the first recess and the second recess with a first dielectric material.

20 Claims, 18 Drawing Sheets

(56) References Cited

U.S. PATENT DOCUMENTS

| | | | |
|---|---|---|---|
| 9,666,502 B2 | 5/2017 | Chen et al. | |
| 9,735,131 B2 | 8/2017 | Su et al. | |
| 11,088,079 B2* | 8/2021 | Cheng | H01L 21/4853 |
| 2010/0133704 A1 | 6/2010 | Marimuthu et al. | |
| 2011/0115082 A1 | 5/2011 | Gluschenkov et al. | |
| 2013/0182402 A1 | 7/2013 | Chen et al. | |
| 2014/0061946 A1 | 3/2014 | Zhao et al. | |
| 2014/0138819 A1 | 5/2014 | Choi et al. | |
| 2014/0252572 A1* | 9/2014 | Hou | H01L 24/96 |
| | | | 257/666 |
| 2015/0303181 A1 | 10/2015 | Kim et al. | |
| 2017/0005073 A1 | 1/2017 | Lin et al. | |
| 2017/0125379 A1 | 5/2017 | Chen et al. | |
| 2018/0138101 A1* | 5/2018 | Yu | H01L 21/563 |
| 2018/0138151 A1* | 5/2018 | Shih | H01L 24/94 |
| 2019/0096796 A1 | 3/2019 | Lin et al. | |
| 2020/0176419 A1* | 6/2020 | Dabral | H01L 23/481 |
| 2021/0202389 A1* | 7/2021 | Hsieh | H01L 23/5383 |

* cited by examiner

CHIP-ON-WAFER STRUCTURE WITH CHIPLET INTERPOSER

PRIORITY CLAIM AND CROSS-REFERENCE

This application claims priority to U.S. Provisional Patent Application No. 63/001,894, filed Mar. 30, 2020, entitled "CoWoS with Chiplet Interposer," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure. In some embodiments, to form a CoWoS structure, a plurality of semiconductor chips are attached to a wafer, and a dicing process is performed next to separate the wafer into a plurality of interposers, where each of the interposers has one or more semiconductor chips attached thereto. The interposer with semiconductor chips(s) attached is referred to as a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
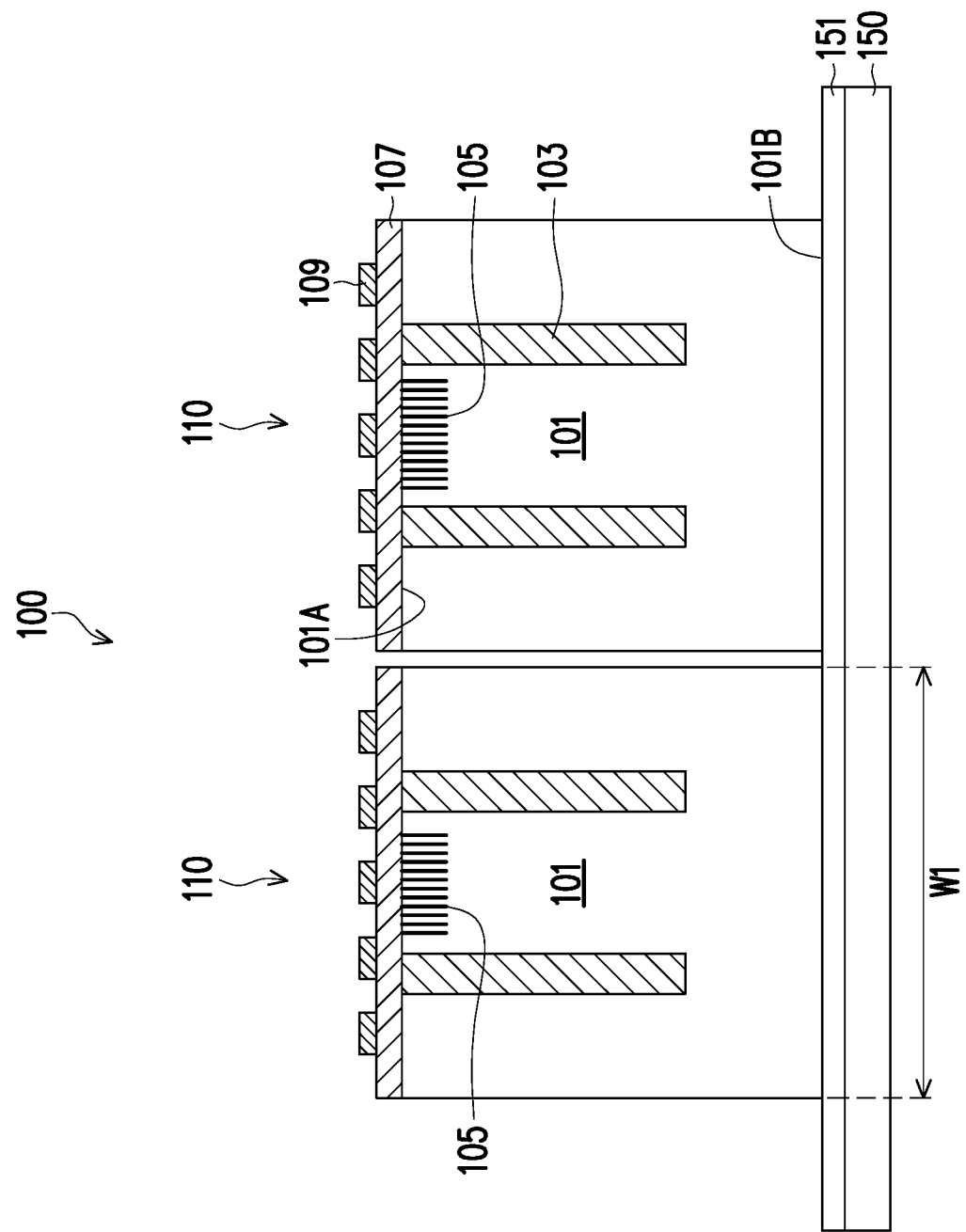
FIGS. 1-9 illustrate cross-sectional views of a chip-on-wafer (CoW) structure at various stages of manufacturing, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a Chip-On-Wafer (CoW) structure is formed by forming a composite interposer and attaching a plurality of dies to the composite interposer. The composite interposer comprises a first interposer and a second interposer embedded in a first molding material. A first redistribution structure may be optionally formed over the first molding material and over the first and the second interposers. After the plurality of dies are attached to the composite interposer, a second molding material is formed around the plurality of dies. Next, each of the first interposer and the second interposer is thinned from a side distal from the dies. After the thinning process, a recess is formed in the side distal from the dies for each of the first interposer and the second interposer, where the recess exposes an end portion of a through via in the respective interposer (the first interposer or the second interposer). Next, a dielectric material (e.g., a polymer material) is formed in the recess. Subsequently, a dielectric layer is formed over the dielectric material, and external connectors are formed over the dielectric layer and electrically coupled to the through vias of the first and the second interposers.

FIGS. 1-9 illustrate cross-sectional views of a Chip-On-Wafer (CoW) structure 100 at various stages of manufacturing, in an embodiment. Referring to FIG. 1, two interposers 110 are attached to a carrier 150, e.g., by an adhesive layer 151. The carrier 150 may be made of a suitable material such as silicon, polymer, polymer composite, metal foil, ceramic, glass, glass epoxy, beryllium oxide, tape, or other suitable material for structural support. The adhesive layer 151 is deposited or laminated over the carrier 150, in some embodiments. The adhesive layer 151 may be photo-sensitive and may be easily detached from the carrier 150 by shining, e.g., an ultra-violet (UV) light on the carrier 150 in a subsequent carrier de-bonding process. For example, the adhesive layer 151 may be a light-to-heat-conversion (LTHC) coating.

Each of the interposers 110 includes a substrate 101, through vias 103 (also referred to as vias, through-substrate vias (TSVs), or conductive pillars) in the substrate 101, a redistribution structure 107 over a first surface 101A of the substrate 101, and conductive pads 109 over and electrically coupled to the redistribution structure 107. FIG. 1 also illustrates electrical components 105 formed in the substrate 101, e.g., near the first surface 101A.

The substrate 101 may be, e.g., a silicon substrate, doped or undoped, or an active layer of a silicon-on-insulator (SOI) substrate. However, the substrate 101 may alternatively be a glass substrate, a ceramic substrate, a polymer substrate, or any other substrate that may provide a suitable protection and/or interconnection functionality. In the illustrated embodiment, the substrate 101 is a silicon substrate (e.g., a bulk silicon substrate).

In some embodiments, the substrate 101 includes electrical components 105, such as resistors, capacitors, signal distribution circuitry, circuitry designed to achieve specific functions (e.g., signal processing functions or logic functions), combinations of these, or the like. These electrical components may be active, passive, or a combination thereof. In other embodiments, the substrate 101 is free from both active and passive electrical components therein. All such combinations are fully intended to be included within the scope of this disclosure. In the illustrate embodiment, electrical components 105, such as deep trench capacitors (DTCs), are formed in the substrate 101. A plurality of DTCs may be formed and connected in parallel to provide a large capacitance and to significantly increase the capacitance density, allowing construction of various devices such as higher quality power delivery networks (PDN).

Through vias 103 extend from the first surface 101A of the substrate 101 toward, but do not reach, a second surface 101B of the substrate 101. In a subsequent substrate thinning process, the substrate 101 is thinned from the second surface 101B, such that the through vias 103 are exposed at the second surface 101B (e.g., extends through the substrate 101). The through vias 103 may be formed of a suitable electrically conductive material such as copper, tungsten, aluminum, alloys, combinations thereof, and the like. A barrier layer 104 (not shown in FIG. 1 but illustrated in FIG. 9) may be formed between the through vias 103 and the substrate 101. The barrier layer 104 may comprise a suitable electrically conductive material such as titanium nitride, although other materials, such as tantalum nitride, titanium, or the like, may alternatively be utilized. In some embodiments, the barrier layer 104 is formed of a dielectric material, such as $SiO_2$ or SiN. A width (e.g., diameter) of the through vias 103 is between about 2 μm and about 50 μm, as an example.

Still referring to FIG. 1, a redistribution structure 107 is formed over each of the interposer 110. The redistribution structure 107 comprises electrically conductive features such as one or more layers of conductive lines and vias formed in one or more dielectric layers. For simplicity, the electrically conductive features and the dielectric layers of the redistribution structure 107 are not illustrated individually in FIG. 1. The redistribution structure 107 provides electrical connections among the through vias 103, the electrical components 105, and the conductive pads 109, in some embodiments.

In some embodiments, the one or more dielectric layers of the redistribution structure 107 are formed of a polymer, such as polybenzoxazole (PBO), polyimide, benzocyclobutene (BCB), or the like. In other embodiments, the dielectric layers are formed of a nitride such as silicon nitride; an oxide such as silicon oxide, phosphosilicate glass (PSG), borosilicate glass (BSG), or boron-doped phosphosilicate glass (BPSG); or the like. The one or more dielectric layers may be formed by any acceptable deposition process, such as spin coating, chemical vapor deposition (CVD), laminating, the like, or a combination thereof.

In some embodiments, the electrically conductive features of the redistribution structure 107 comprise conductive lines and/or conductive vias formed of a suitable conductive material such as copper, titanium, tungsten, aluminum, or the like. The conductive features may be formed by, e.g., forming openings in the dielectric layer to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. Other methods for forming the electrically conductive features of the redistribution structure 107 are possible, and are fully intended to be included within the scope of the present disclosure.

The conductive pads 109 are formed over and electrically coupled to the electrically conductive features of the redistribution structure 107. The conductive pads 109 may be of any suitable type, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like.

In the example of FIG. 1, the redistribution structure 107 is formed to have a same width W1 as the substrate 101, such that sidewalls of the redistribution structure 107 are aligned with respective sidewalls of the substrate 101. The width W1 is between about 1 mm and about 52 mm, in some embodiments. Although FIG. 1 illustrates two interposers 110 being used to form the CoW structure 100, other numbers of interposers 110 may be used to form the CoW structure 100, as skilled artisans readily appreciate.

Figure 2:
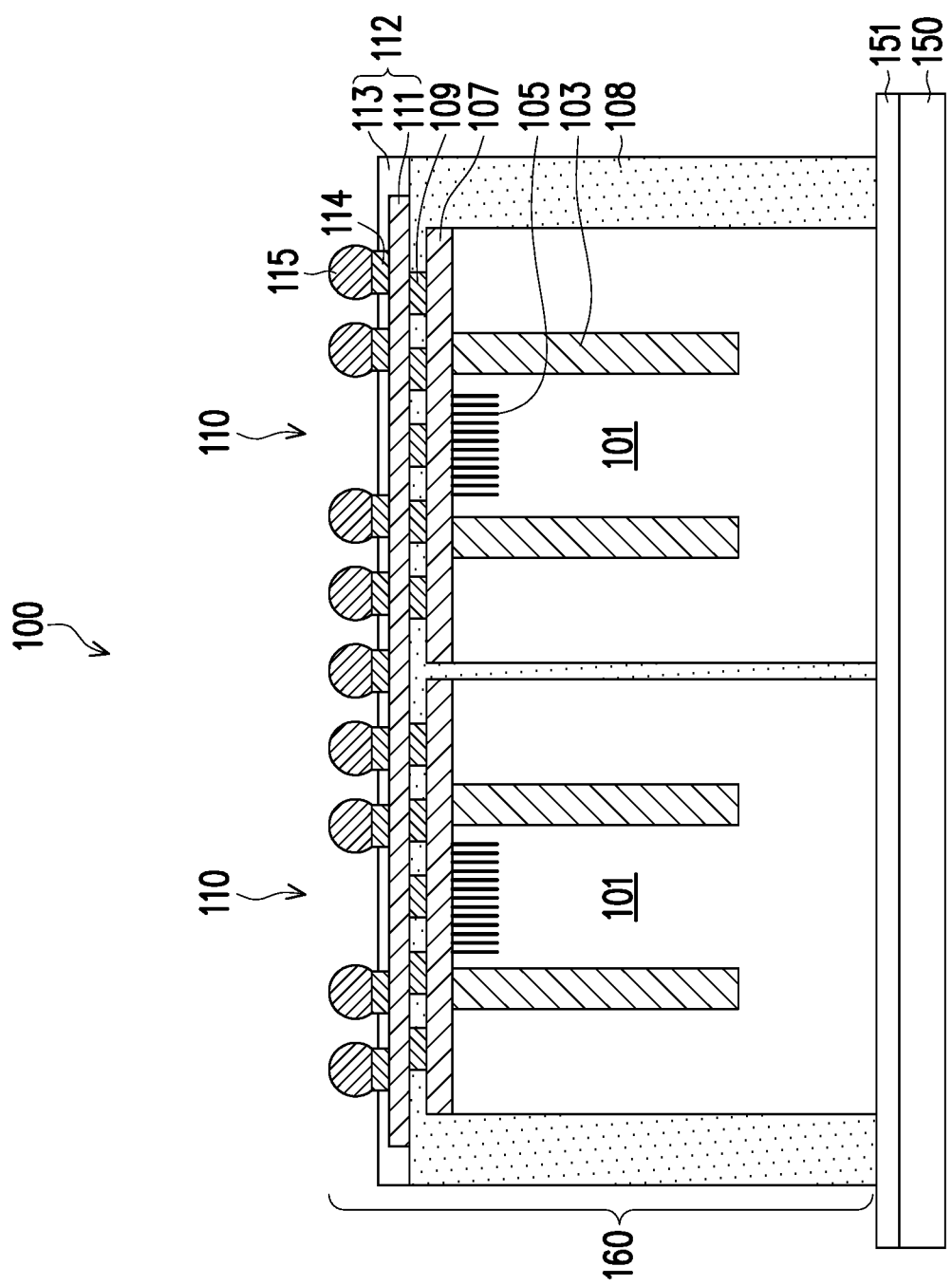

Next, in FIG. 2, a molding material 108 is formed over the carrier 150 around the interposers 110, and a redistribution structure 112 is formed over the molding material 108 and the interposers 110. Conductive connectors 114 are formed over the redistribution structure 112.

The molding material 108 may comprise an epoxy, an organic polymer, a polymer with or without a silica-based filler or glass filler added, or other materials, as examples. In some embodiments, the molding material 108 comprises a liquid molding compound (LMC) that is a gel type liquid when applied. The molding material 108 may also comprise a liquid or solid when applied. Alternatively, the molding material 108 may comprise other insulating and/or encapsulating materials. The molding material 108 is applied using a wafer level molding process in some embodiments. The molding material 108 may be molded using, for example, compressive molding, transfer molding, molded underfill (MUF), or other methods.

Next, the molding material 108 is cured using a curing process, in some embodiments. The curing process may comprise heating the molding material 108 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 108 may be cured using other methods. In some embodiments, a curing process is not included.

After the molding material 108 is formed, a planarization process, such as chemical and mechanical planarization (CMP), may be performed to remove excess portions of the molding material 108, such that the molding material 108 and the conductive pads 109 have a coplanar upper surface. As illustrated in FIG. 2, the molding material 108 surrounds and physically contacts sidewalls of the interposers 110.

Next, the redistribution structure 112 is formed over the upper surface of the molding material 108 and is electrically coupled to the conductive pads 109. The redistribution structure 112 includes one or more layer of electrically conductive features 111 (e.g., conductive lines and/or vias) formed in one or more dielectric layers 113. The materials and the formation method for the redistribution structure 112 may be the same as or similar to that of the redistribution structure 107, thus details are not repeated. In the example of FIG. 2, the redistribution structure 112 are formed to be coterminous (e.g., having a same width) with the molding material 108, such that sidewalls of the redistribution structure 112 are aligned with respective sidewalls of the molding material 108. The redistribution structure 112 in FIG. 2 extends continuously from the interposer 110 on the left to the interposer 110 on the right.

Next, conductive connectors 114 are formed over the redistribution structure 112 and electrically coupled to the electrically conductive features 111 of the redistribution structure 112. The conductive connectors 114 may be of any suitable type, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. Solder regions 115 may be formed over the conductive connectors 114, as illustrated in FIG. 2.

In the example of FIG. 2, the interposers 110, the molding material 108, the redistribution structure 112, and conductive connectors 114 form a composite interposer 160, which is used as the interposer in the CoW structure 100. Since a plurality of interposers 110 are used to form the composite interposer 160, each of the interposers 110 may also be referred to as a chiplet interposer.

Figure 3:
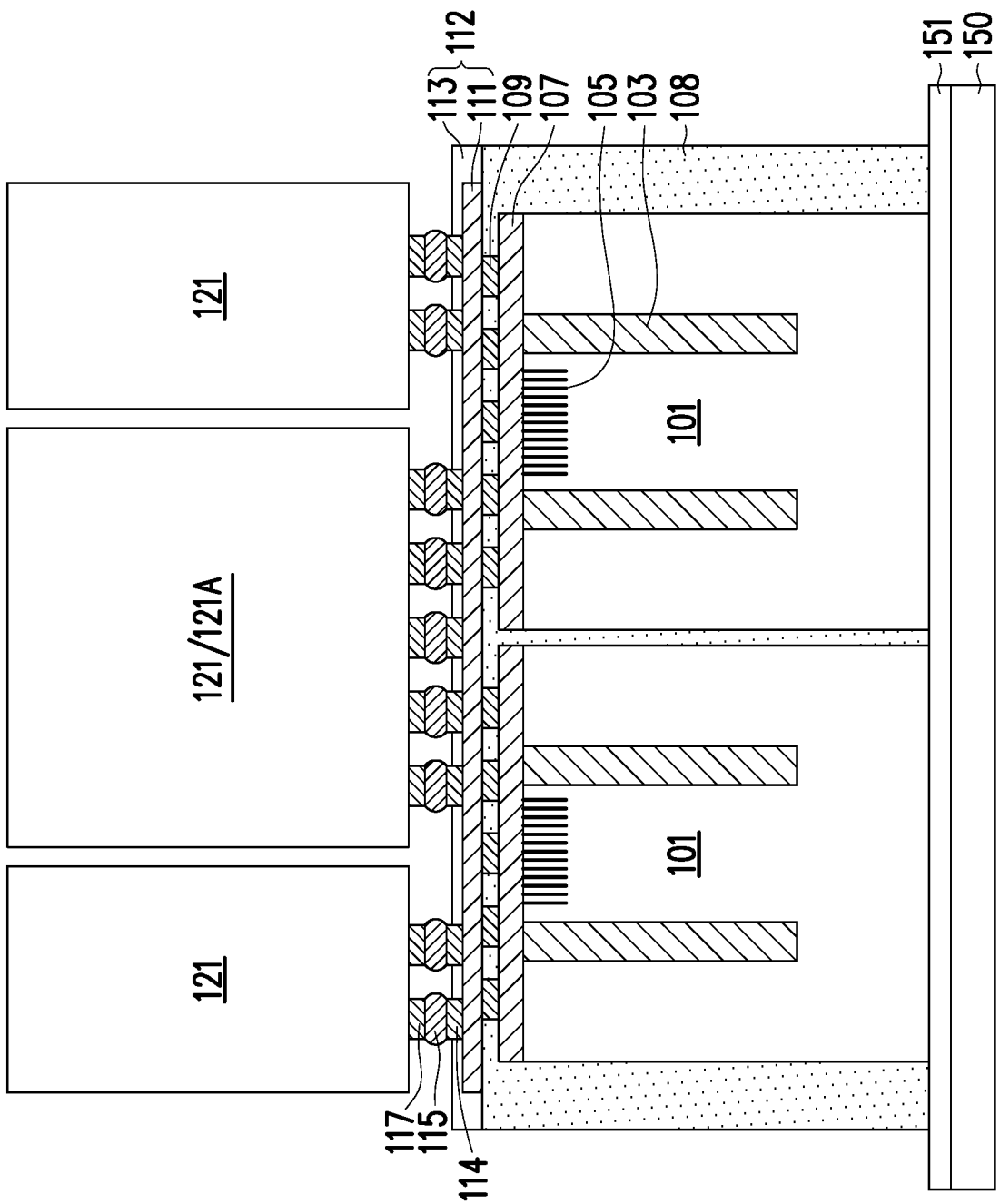

Next, in FIG. 3, semiconductor dies 121 (also referred to as dies, or integrated circuit (IC) dies) are attached to the conductive connectors 114, e.g., through a reflow process such that die connectors 117 of the dies 121 are bonded to respective ones of the conductive connectors 114. The dies 121 may be of different types, in some embodiments. For example, one of the dies 121 may be a logic die while another die 121 may be a memory die. In some embodiments, all of the dies 121 are of a same type. In the example of FIG. 3, one of the dies 121 (e.g., the die 121A in the middle) overlaps with the interposer 110 on the left, and overlaps with interposer 110 on the right. In other words, a first portion of the die 121A is disposed within the lateral extents of the interposer 110 on the left, and a second portion of the die 121A is disposed within the lateral extents of the interposer 110 on the right.

Each of the dies 121 includes a substrate, electrical components (e.g., transistors, resistors, capacitors, diodes, or the like) formed in/on the substrate, and an interconnect structure over the substrate connecting the electrical components to form functional circuits of the die 121. The die 121 also includes die connectors 117 that provide electrical connection to the circuits of the die 121.

The substrate of the die 121 may be a semiconductor substrate, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The electrical components of the die 121 comprise a wide variety of active devices (e.g., transistors) and passive devices (e.g., capacitors, resistors, inductors), and the like. The electrical components of the die 121 may be formed using any suitable methods either within or on the substrate of the die 121. The interconnect structure of the die 121 comprises one or more metallization layers (e.g., copper layers) formed in one or more dielectric layers, and is used to connect the various electrical components to form functional circuitry. In an embodiment the interconnect structure is formed of alternating layers of dielectric and conductive material (e.g., copper) and may be formed through any suitable process (such as deposition, damascene, dual damascene, etc.).

One or more passivation layers may be formed over the interconnect structure of the die 121 in order to provide a degree of protection for the underlying structures of the die 121. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads may be formed over the passivation layer and may extend through the passivation layer to be in electrical contact with the interconnect structure of the die 121. The conductive pads may comprise aluminum, but other materials, such as copper, may alternatively be used.

Die connectors 117 of the die 121 are formed on the conductive pads to provide conductive regions for electrical connection to the circuits of the die 121. The die connectors 117 may be copper pillars, contact bumps such as microbumps, or the like, and may comprise a material such as copper, tin, silver, or other suitable material.

Figure 4:
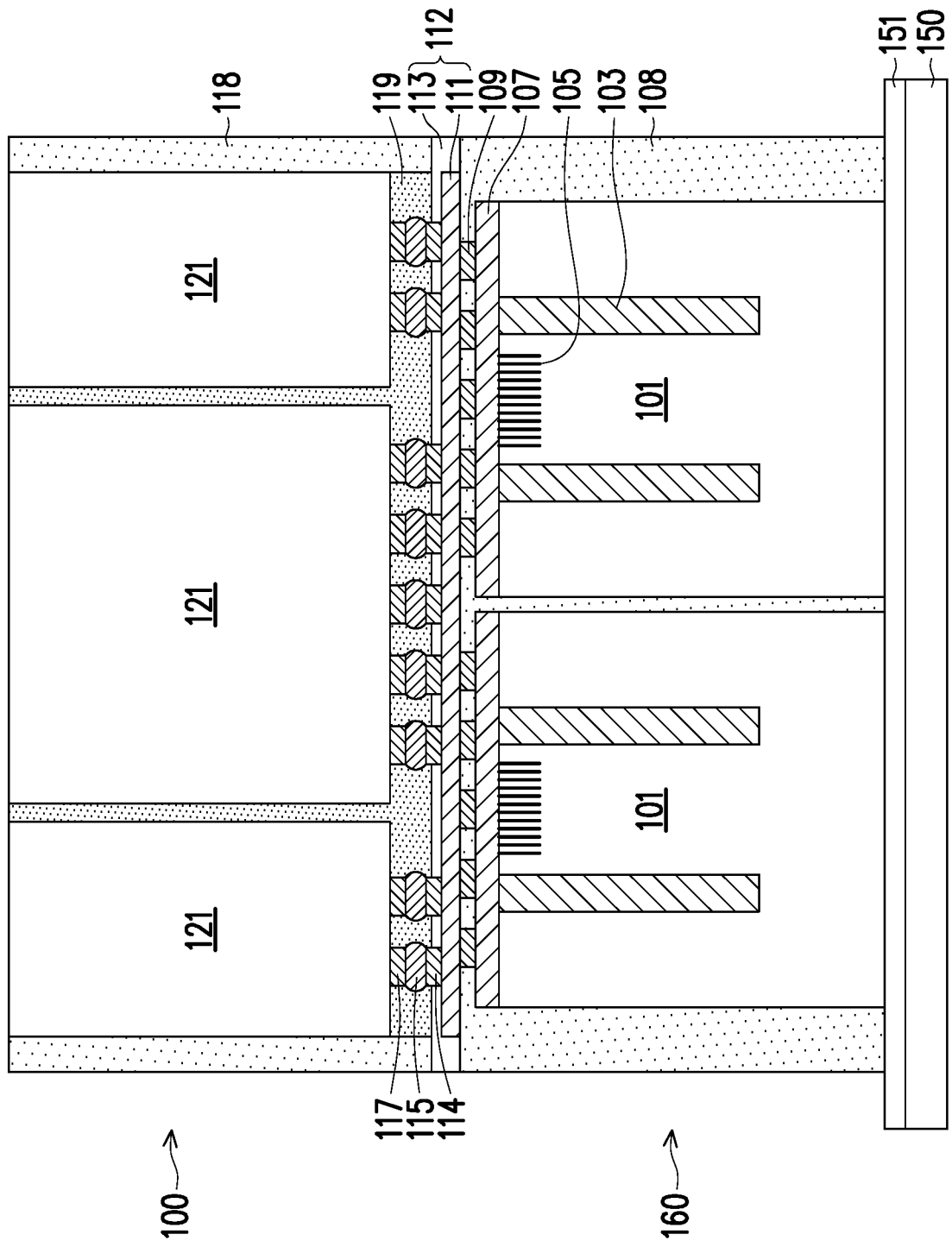

Next, in FIG. 4, an underfill material 119 is formed between the dies 121 and the redistribution structure 112 of the composite interposer 160, and between adjacent dies 121. After the underfill material 119 is formed, a molding material 118 is formed over the redistribution structure 112 around the dies 121.

The underfill material 119 may comprise a liquid epoxy that is dispensed in a gap between the dies 121 and the redistribution structure 112, e.g., using a dispensing needle or other suitable dispensing tool, and then cured to harden. As illustrated in FIG. 4, the underfill material 119 fills the gap between the dies 121 and the redistribution structure 112. In some embodiments, the dies 121 are attached to the redistribution structure 112 such that the gaps between adjacent dies 121 is smaller than about 10 µm (e.g., ≤10 µm), such that the dispensed underfill material 119 is able to fill the gaps between sidewalls of the dies 121 through capillary force. In other embodiments, the underfill material 119 is omitted.

Next, the molding material 118 is formed over the composite interposer 160 and around the dies 121. The material(s) and the formation method of the molding material 118 may be the same as or similar to that of the molding material 108, thus details are not repeated here. In some embodiments, the underfill material 119 is not formed, and a molded underfill (MUF) material is used as the molding material 118, which MUF material fills the gap between the dies 121 and the composite interposer 160, and fills the gaps between adjacent dies 121.

Figure 5:
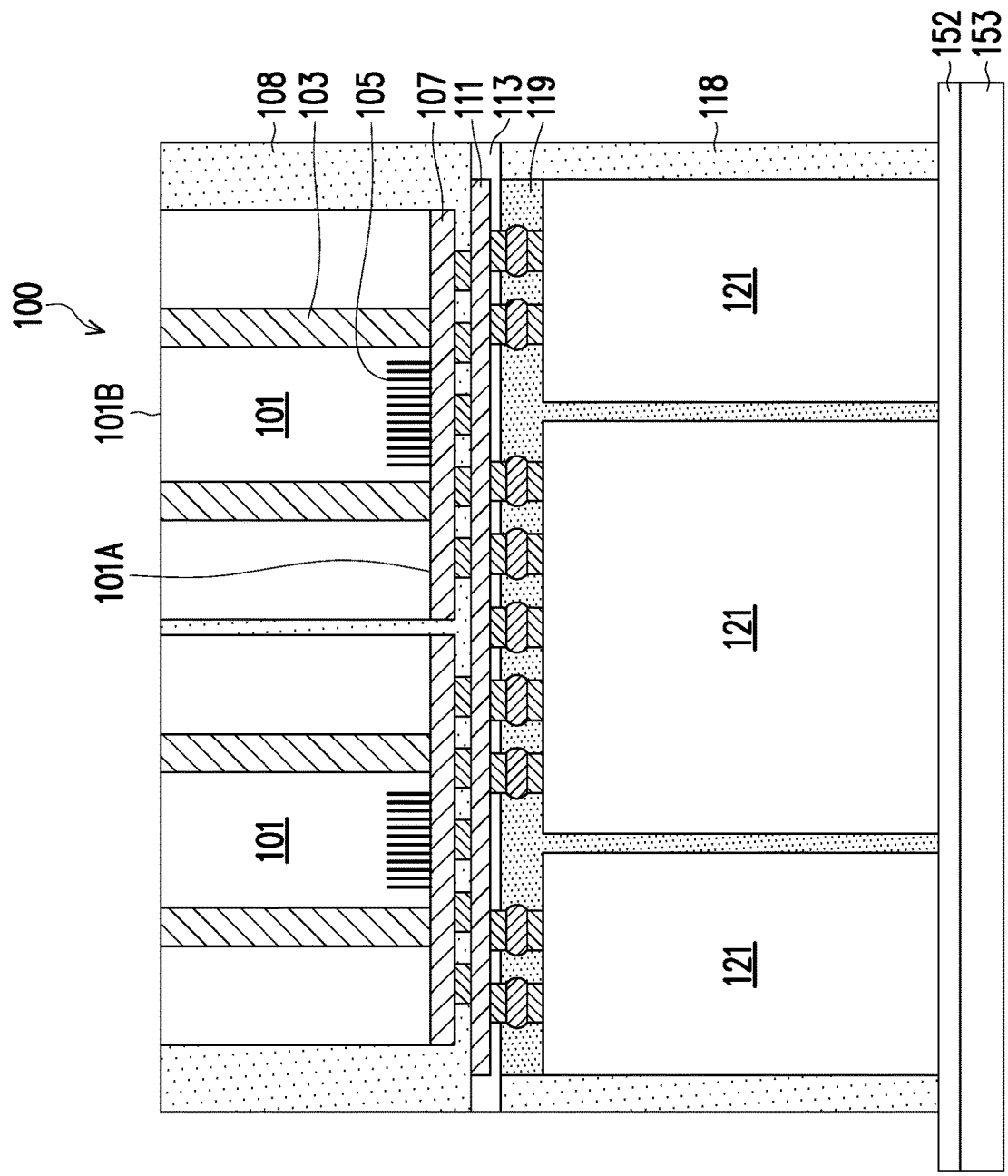

Next, in FIG. 5, the structure of FIG. 4 is flipped over, and the dies 121 are attached to a carrier 153, e.g., through an adhesive layer 152. The carrier 153 and the adhesive layer 152 may be the same as or similar to the carrier 150 and the adhesive layer 151, respectively, thus details are not repeated. Next, the carrier 150 is removed by a carrier de-bonding process. The carrier de-bonding process may remove the carrier 150 using any suitable process, such as etching, grinding, and mechanical peel off. In some embodiments, the carrier 150 is de-bonded by shining a laser or UV light over the surface of the carrier 150. The laser or UV light breaks the chemical bonds of the adhesive layer 151 that binds to the carrier 150, and the carrier 150 can then be easily detached. The adhesive layer 151 may be removed by the carrier de-bonding process. In some embodiments, an additional cleaning process is performed to remove the adhesive layer 151.

After the carrier de-bonding process, a thinning process is performed to reduce a thickness of the substrates 101 and a thickness of the molding material 108. The thinning process may be any suitable process, such as a CMP process. The thinning process is performed from the second surface 101B of the substrates 101 exposed by the removal of the carrier 150. The thinning process continues until the through vias 103 are exposed. Therefore, after the thinning process, the through vias 103, the substrates 101, and the molding material 108 have a coplanar upper surface in FIG. 5. Note that due to the thinning process, the distance between the first surface 101A and the second surface 101B of the substrate 101 (e.g., thickness of the substrate 101) in FIG. 5 is smaller than that in FIG. 1.

Figure 6:
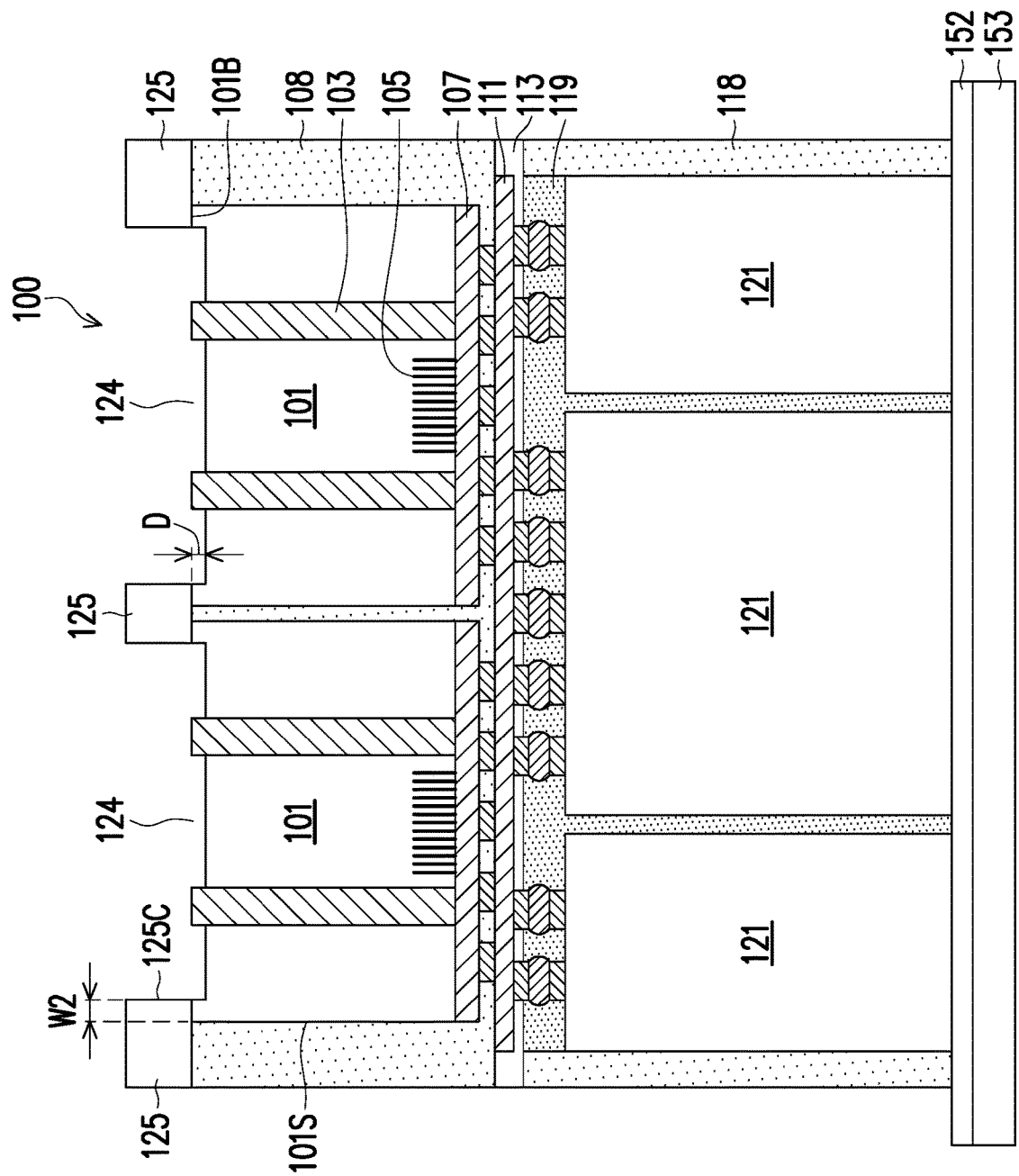

Next, in FIG. 6, a patterned mask layer 125, such as photoresist layer, is formed over the structure of FIG. 5. The patterned mask layer 125 is formed to cover (e.g., completely cover) the upper surface of the molding material 108 in FIG. 6. In addition, the patterned mask layer 125 also covers portions (e.g., portions physically contacting the molding material 108) of the substrates 101 directly underlying the patterned mask layer 125. In other words, besides covering the upper surface of the molding material 108, the patterned mask layer 125 also overlaps with portions of the substrates 101. In some embodiments, a distance W2, measured between a sidewall 125C of the patterned mask layer 125 (which overlaps with the substrate 101) and a closest sidewall 1015 of the substrates (which contacts the molding material 108), is between about 0 mm and about 10 mm (e.g., 0 mm<W2<10 mm).

Next, portions (e.g., upper layers) of the substrates 101 exposed by openings of the patterned mask layer 125 are removed to form recesses 124 at the second surface 101B of the substrates 101. An etching process, such as an anisotropic etching process, may be performed to form the recesses 124. The etching process may use an etchant selective to (e.g., having a higher etching rate for) the material of the substrate 101 such that the substrate 101 is etched without substantially attacking the through vias 103 and the barrier layer 104 (see FIG. 9). After the etching process is finished, end portions of the through vias 103 are exposed by the recesses 124. In other words, the end portions of the through vias 103 extend into the recesses 124. In some embodiments, a depth D of each of the recesses 124, measured along the vertical direction of FIG. 6 between the second surface 101B of the substrate 101 and a bottom of the recess 124, is between about 0 μm and about 10 μm (e.g., 0 μm<D<10 μm).

Figure 7:
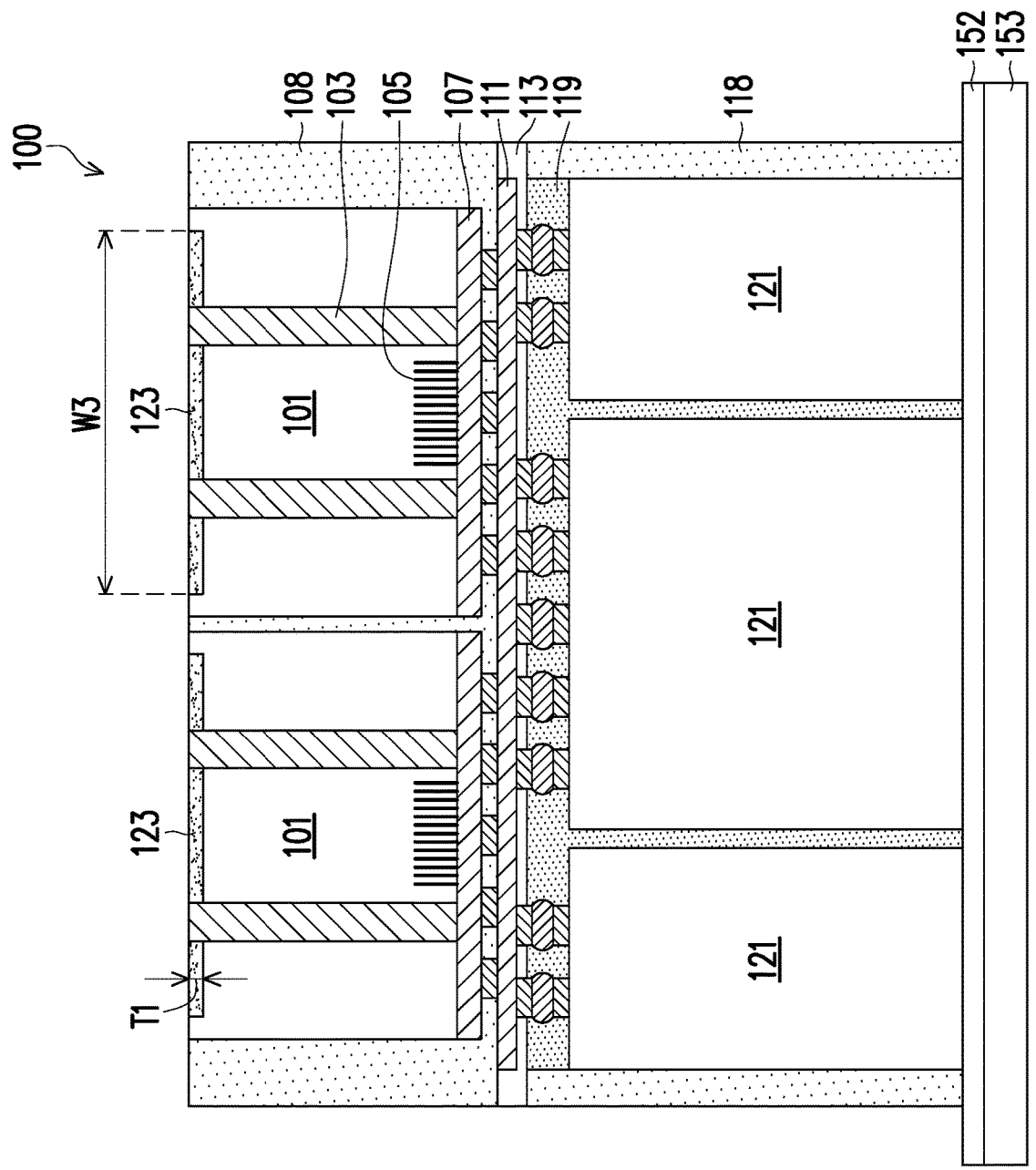

Next, in FIG. 7, a material 123 (e.g., a dielectric material) is formed in the recesses 124, and the patterned mask layer 125 is removed. The material 123 is a polymer material, such as polyimide, and is formed by a suitable formation method such as spin coating, in an example embodiment. Besides polymer material, other suitable dielectric material, such as SiN or $SiO_2$, may also be used to form the material 123 using any suitable formation method, such as chemical vapor deposition (CVD), physical vapor deposition (PVD), atomic layer deposition (ALD), or the like. The material 123 may overfill the recess 124 and may be formed over the molding material 108, and therefore, a planarization process, such as CMP, may be performed to remove excess portions of the material 123, such that the material 123, the substrates 101, the through vias 103, and the molding material 108 have a coplanar upper surface in FIG. 7. A thickness T1 of the material 123 after the planarization process may be between 0 μm and about 5 μm (e.g., 0 μm<T1<5 μm), as an example. As illustrated in FIG. 7, the material 123 is embedded in the substrate 101 (e.g., a silicon substrate), and has a width W3 (measured along the horizontal direction) smaller than the width W1 of the substrate 101. In the illustrated embodiment, the material 123 covers (e.g., surrounds) sidewalls of the end portions of the through vias 103. In some embodiments, by forming the material 123 using a relative cheap formation method, (e.g., spin coating), a subsequent isolation deposition process, such as a CVD process with high level of vacuum to form a layer of SiN around the through vias 103, is obviated, thereby avoiding the higher cost of the high vacuum CVD process.

Figure 8:
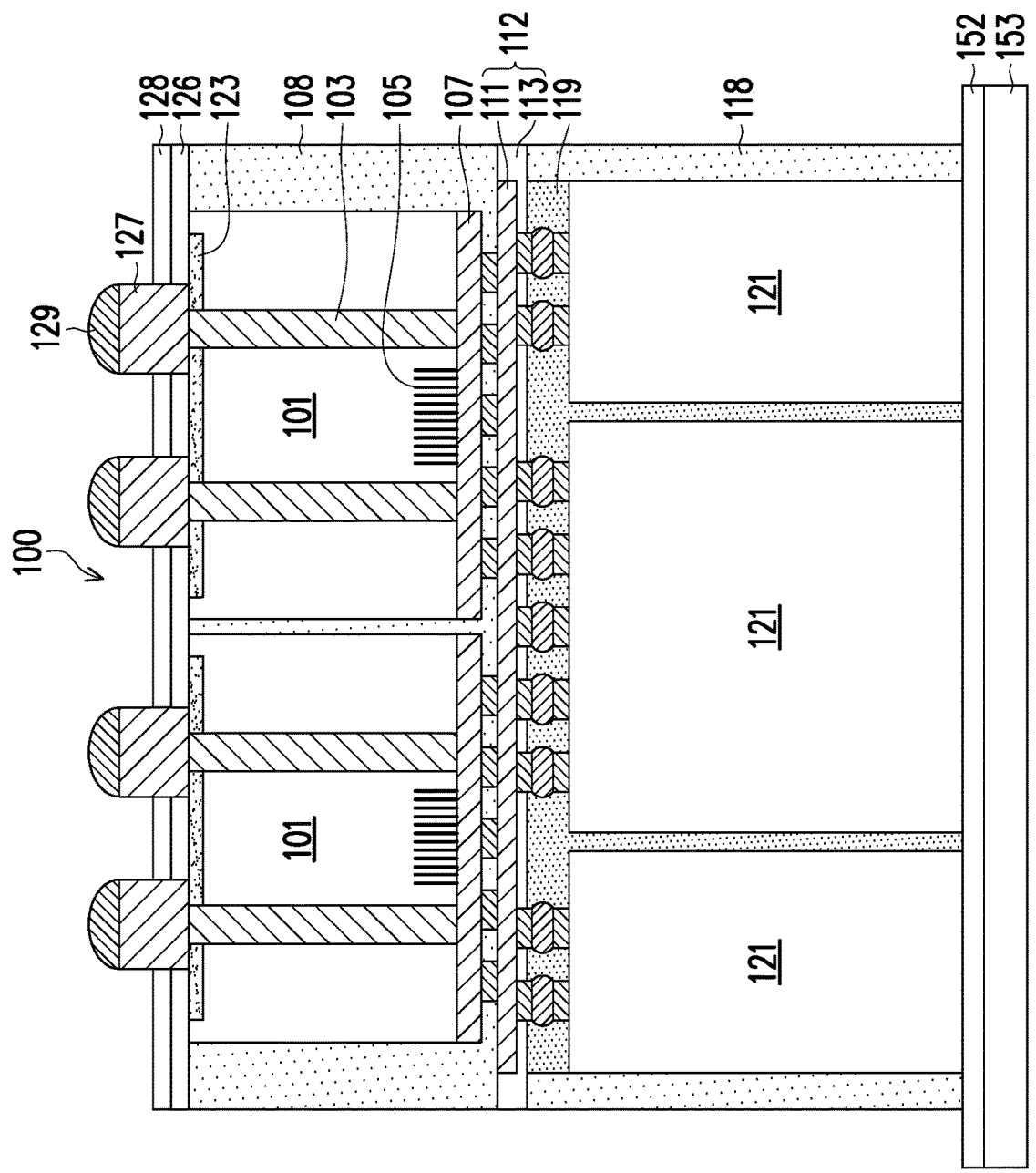

Next, in FIG. 8, a redistribution structure 126 is formed over the material 123, the substrates 101, and the molding material 108, and thereafter, a polymer layer 128 is formed over the redistribution structure 126. External connectors 127 are formed over the polymer layer 128 and electrically coupled to the through vias 103.

In some embodiments, the redistribution structure 126 comprises one or more dielectric layers and electrically conductive features (e.g., conductive lines, vias) formed in the one or more dielectric layers, using a same or similar formation method as the redistribution structure 112. For simplicity, FIG. 8 and subsequent figures may show the redistribution structure 126 as a single layer, with the understanding that the redistribution structure 126 may have one or more layers of conductive features formed in one or more dielectric layers. In some embodiments, the redistribution structure 126 is omitted, and the polymer layer 128 is formed directly on (e.g., contacting) the material 123. The polymer layer 128 is formed of a same polymer material as the material 123, such as polyimide, in some embodiments, although the polymer layer 128 may be formed of a different polymer material than the material 123. The polymer layer 128 may function as a passivation layer for the CoW structure 100. A thickness of the polymer layer 128 is larger than 0 μm and less than about 20 μm, as an example.

Next, the external connectors 127 are formed over the polymer layer 128. In the illustrated embodiment, the external connectors 127 extend through the polymer layer 128, and are electrically coupled to the through vias 103. The external connectors 127 may be, e.g., microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. A width (e.g., diameter) of the external connectors 127 may be between about 20 μm and about 300 μm, as an example. Solder regions 129 may be formed over the external connectors 127, as illustrated in FIG. 8.

Figure 9:
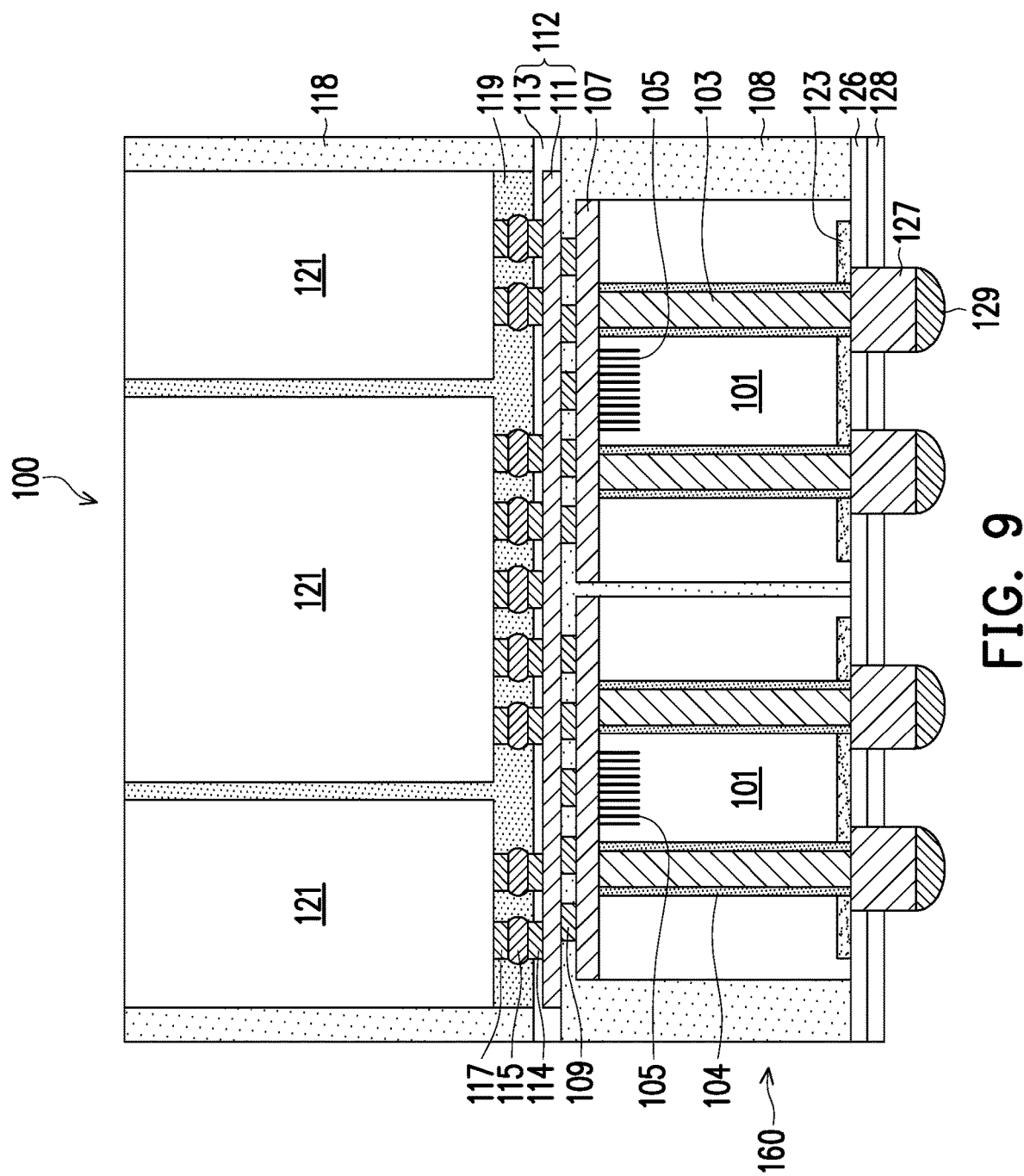

Next, in FIG. 9, the carrier 153 and the adhesive layer 152 are removed, e.g., by a carrier de-bonding process, and the Chip-On-Wafer (CoW) structure 100 is formed. Although not illustrated, a dicing process may be performed to separate the CoW structure 100 from other CoW structures formed at the same time as the CoW structure 100 during the manufacturing process, as skilled artisans readily appreciate. The external connectors 127 of the CoW structure 100 may then be bonded to a substrate (e.g. a printed circuit board (PCB)) to form a Chip-On-Wafer-On-Substrate (CoWoS) structure.

Figure 10:
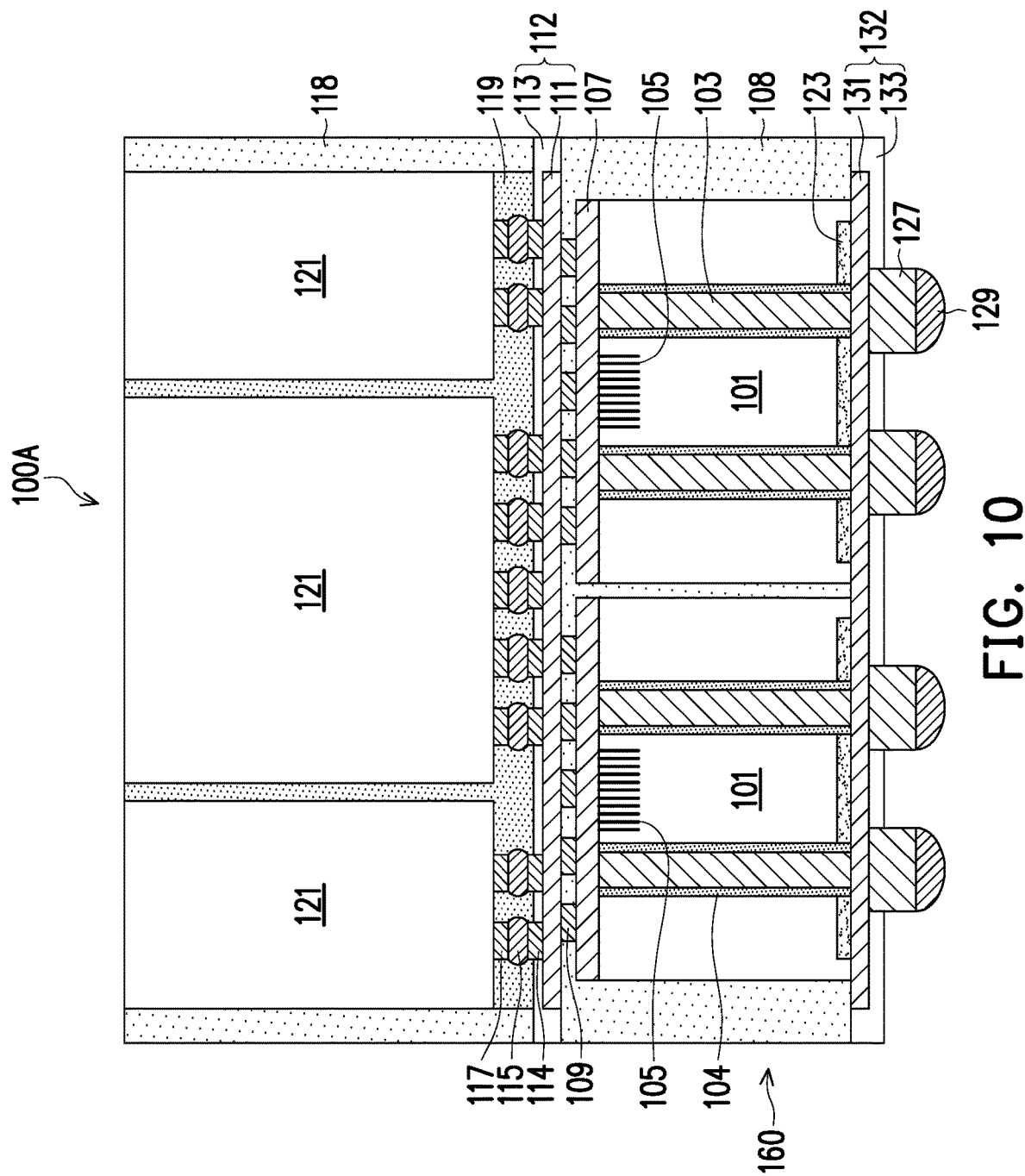
FIG. 10 illustrates a cross-sectional view of a CoW structure, in another embodiment.

FIG. 10 illustrates a cross-sectional view of a CoW structure 100A, in another embodiment. The CoW structure 100A is similar to the CoW structure 100 of FIG. 9, but the polymer layer 128 and the redistribution structure 126 (if formed) in FIG. 9 are replaced by a redistribution structure 132. In some embodiments, the CoW structure 100A is formed by following the same or similar processing steps in FIGS. 1-9, but in the processing step of FIG. 8, the redistribution structure 132 (which includes electrically conductive features 131 and one or more dielectric layers 133) is formed in place of the polymer layer 128 and the redistribution structure 126.

Figure 11:
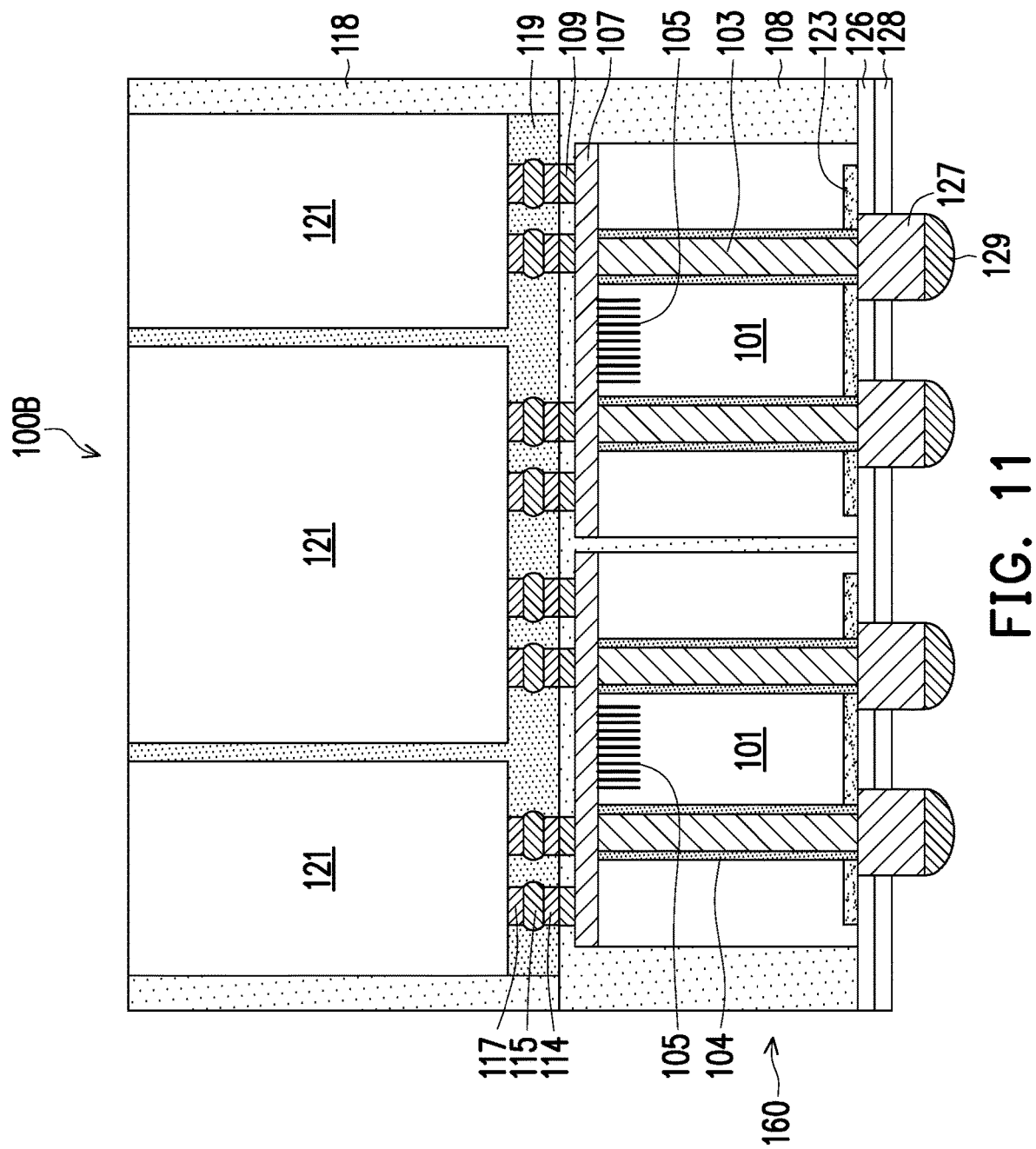
FIG. 11 illustrates a cross-sectional view of a CoW structure, in another embodiment.

FIG. 11 illustrates a cross-sectional view of a CoW structure 100B, in another embodiment. The CoW structure 100B is similar to the CoW structure 100 of FIG. 9, but the CoW structure 100B does not have the redistribution structure 112 formed in the composite interposer 160. In some embodiments, the CoW structure 100B is formed by following the same or similar processing steps in FIGS. 1-9, but in the processing step of FIG. 2, the redistribution structure 112 is omitted, and conductive connectors 114 are formed directly on respective underlying conductive pads 109. Next, in the processing similar to that of FIG. 3 for the CoW structure 100B, the die connectors 117 of the dies 121 are bonded to the conductive connectors 114.

Figure 12:
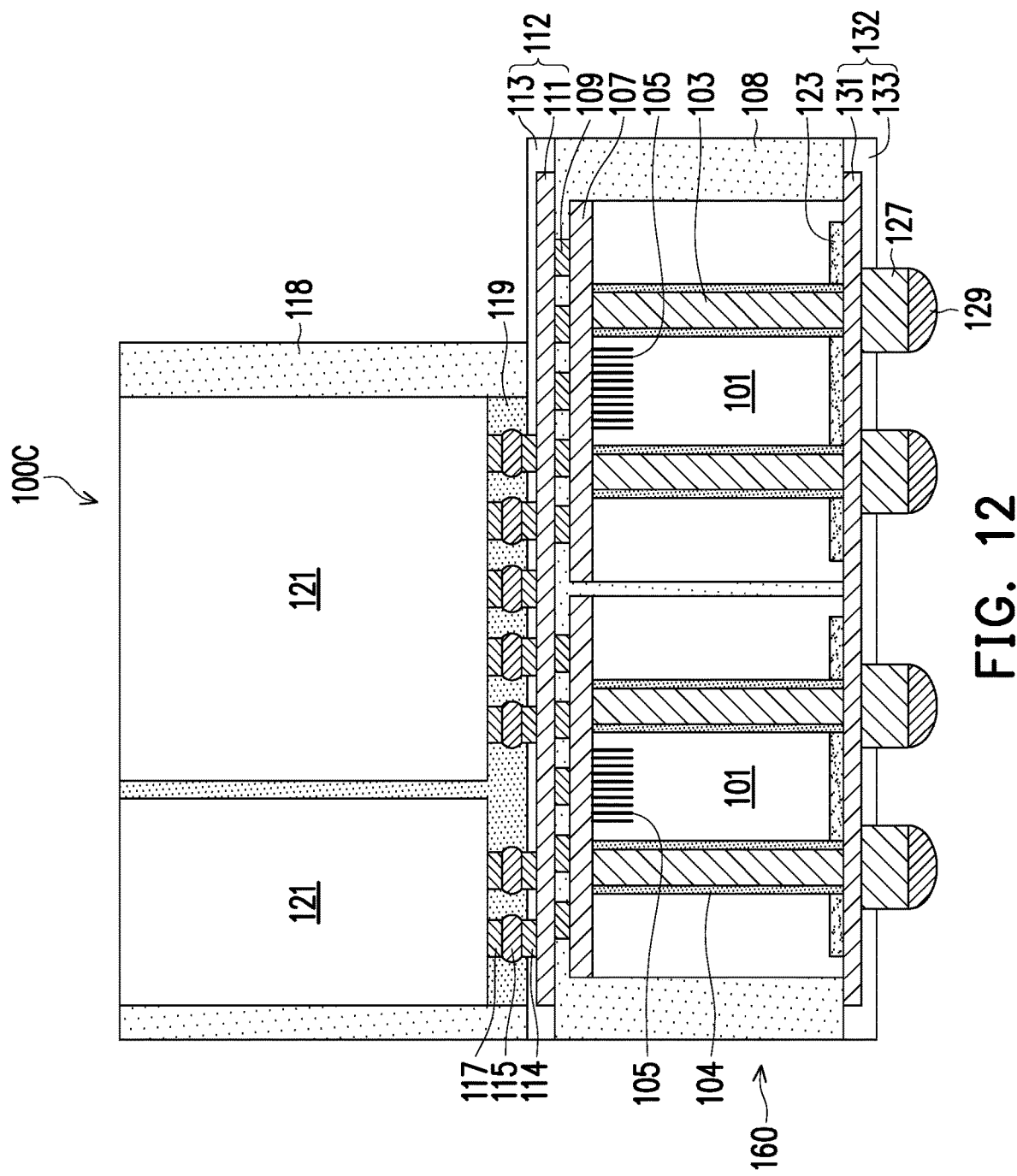
FIG. 12 illustrates a cross-sectional view of a CoW structure, in another embodiment.

FIG. 12 illustrates a cross-sectional view of a CoW structure 100C, in yet another embodiment. The CoW structure 100C is similar to the CoW structure 100A of FIG. 10, but the number of dies 121 may be less, and the molding material 118 of the CoW structure 100C has a width smaller than that of the molding material 118 of the CoW structure 100A. For example, in the CoW structures 100, 100A, and 100B, the molding material 118 and the molding material 108 have a same width, such that sidewalls of the molding material 118 are aligned with respective sidewalls of the molding material 108. In the CoW structure 100C, the left sidewall of the molding material 118 is aligned with the left sidewall of the molding material 108, while the right sidewall of the molding material 118 is misaligned with (e.g., is laterally spaced from) the right sidewall of the molding material 108. The shape of the molding material 118 in the CoW structure 100C may be formed by, e.g., performing an etching process to remove a portion (e.g., a portion on the right in FIG. 12) of the molding material 118. As another example, the molding material 118 may be formed using a suitable formation method, e.g., an injection molding process, to have the shape illustrated in FIG. 12 directly. The CoW structure 100C may be suitable for optical connection applications where an optical waveguide formed in the substrate 101 are exposed by the molding material 118.

Embodiments may achieve advantages. For example, by forming electrical components 105 in the substrate 101 of the interposer 110, the interposer 110 may be designed to include various functional circuits for achieving different functions, instead of simply serving the function of electrical routing (e.g., having only vias and conductive lines in the interposer). As integration density of CoW structure increases, the size of the interposer may be increased to accommodate the number of dies attached to the interposer. However, a large interposer may require a higher standard (thus higher cost) for the planarity of the interposer, in order to avoid issues related with non-planarity of the interposer, such as cold joint and stress related structural failure. The current disclosure allows a large composite interposer 160 to be formed easily using a plurality of smaller chiplet interposers 110, thus avoiding the cost associated with maintaining the planarity of a larger interposer. In addition, by forming electrical components 105, such as DTCs in the interposers 110 and electrically coupling the DTCs in all the interposers 110 through, e.g., the redistribution structure 112, the number of DTCs formed in the composite interposer 160 may be greatly increased. As another example, the formation of the material 123 obviates the need to perform a high vacuum CVD process, thereby reducing the manufacturing cost.

FIGS. 13-17 illustrate cross-sectional views of a CoW structure 100D at various stages of manufacturing, in yet another embodiment. The CoW structure 100D is similar to the CoW structure 100, but may be formed in different processing steps.

Figure 13:
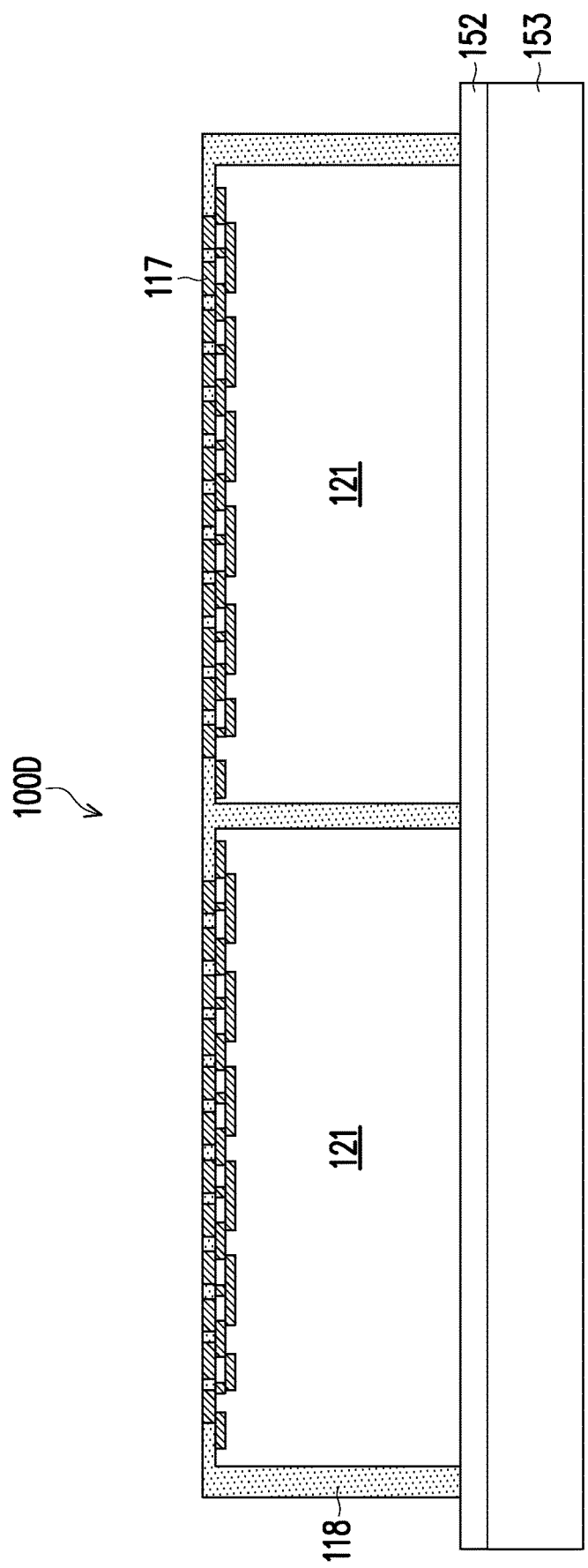
FIGS. 13-17 illustrate cross-sectional views of a CoW structure at various stages of manufacturing, in yet another embodiment.

Referring to FIG. 13, semiconductor dies 121 are attached to the carrier 153, e.g., through the adhesive layer 152. Next, the molding material 118 is formed over the carrier 153 around the semiconductor dies 121. A planarization process, such as CMP, may be performed to achieve a coplanar upper surface between the die connectors 117 of the semiconductor dies and the molding material 118.

Figure 14:
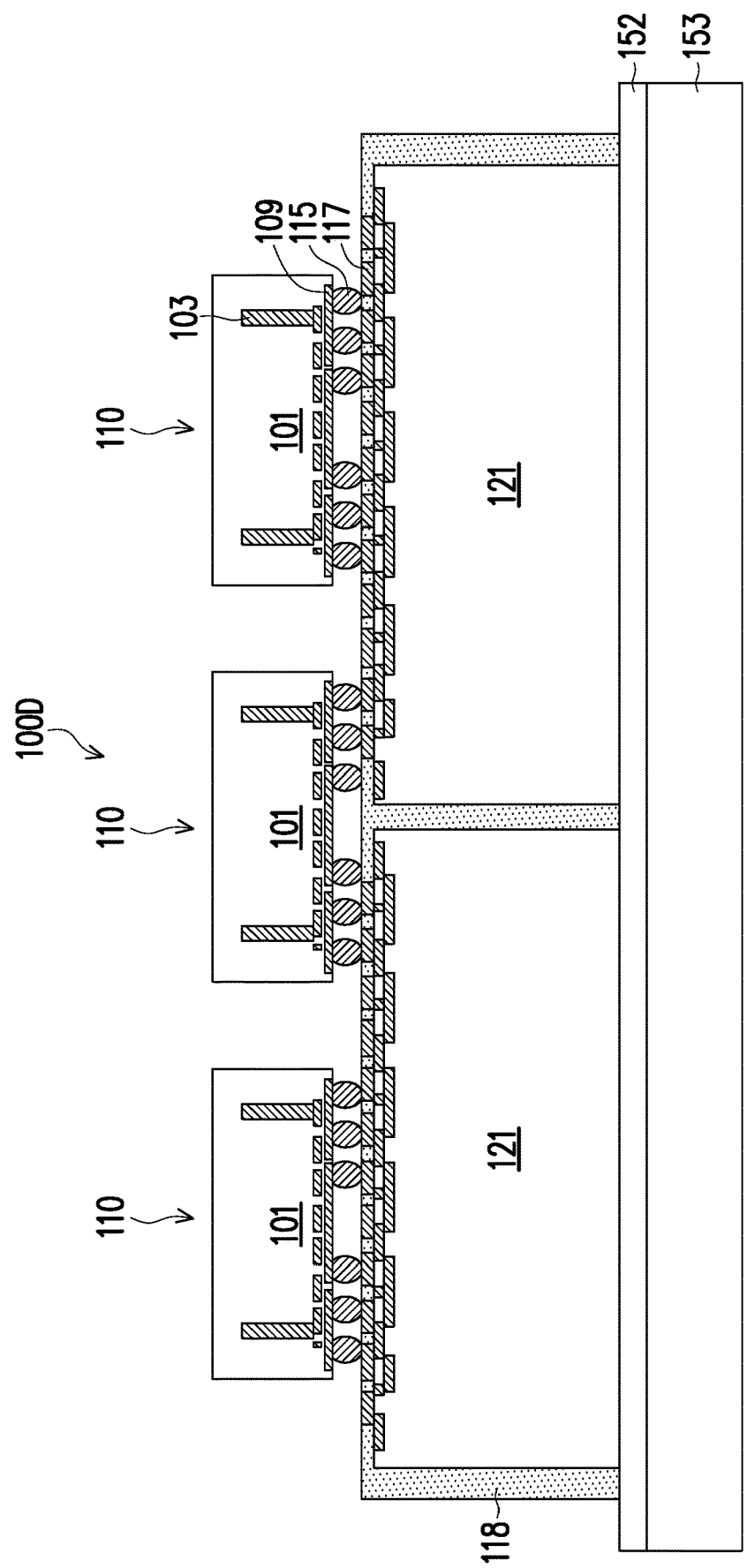

Next, in FIG. 14, a plurality of interposers no are attached to the dies 121. The conductive pads 109 of the interposers no are bonded to the die connectors 117 of the dies 121 through solder regions 115, in the illustrated embodiment. Each of the interposer no has through vias 103 formed in its substrate 101. The through vias 103 do not extend through the substrates 101 in FIG. 14. In a subsequent substrate thinning process, the substrates 101 are thinned such that the through vias 103 extend through the substrates 101.

Figure 15:
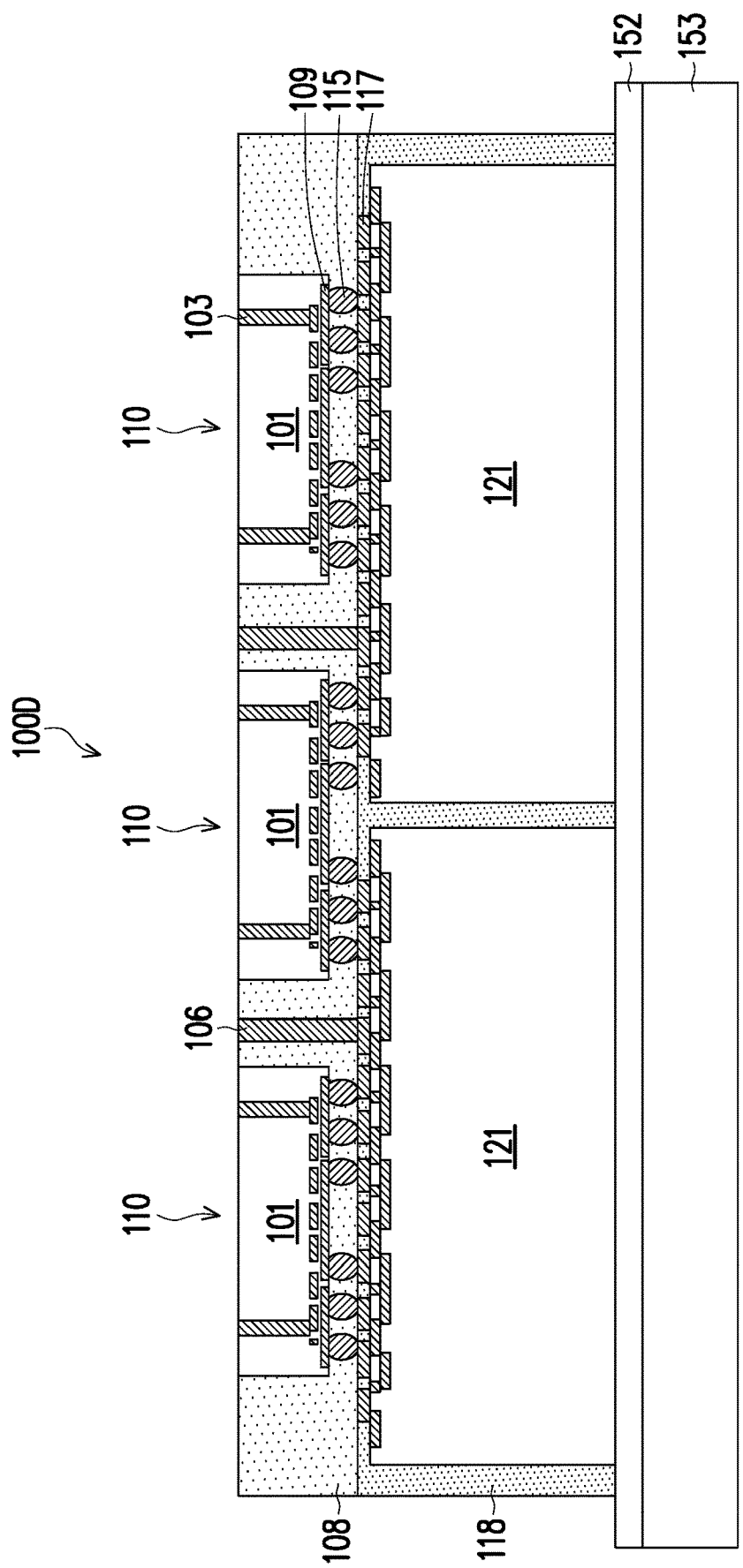

Next, in FIG. 15, the molding material 108 is formed over the molding material 118 and around the interposers 110. A thinning process, such as a grinding process, is performed to thin the substrates 101, such that the through vias 103 are exposed at the upper surface of the substrates 101 in FIG. 15. As a result of the thinning process, a coplanar upper surface is achieved between the substrates 101 and the molding material 108. FIG. 15 further illustrates through molding vias 106, which may be formed by forming openings in the molding material 108 (e.g., using a laser drilling process, or photolithography and etching techniques) to expose corresponding die connectors 117, and filling the openings with an electrically conductive material (e.g., copper) using an acceptable formation method such as plating. FIGS. 13-15 show the molding materials (e.g., 118 and 108) being formed in two separated processing steps as a non-limiting example, other ways to form molding materials around the dies 121 and around the interposers 110 are possible and are fully intended to be included within the scope of the present disclosure. In some embodiments, after the dies 121 are attached to the carrier 153, the interposers 110 are attached to the dies 121 before the molding material (e.g., 118) is formed. Then, after the interposer 110 are attached, a single molding process is performed to forming a molding material that surrounds the dies 121 and the interposers 110.

Figure 16:
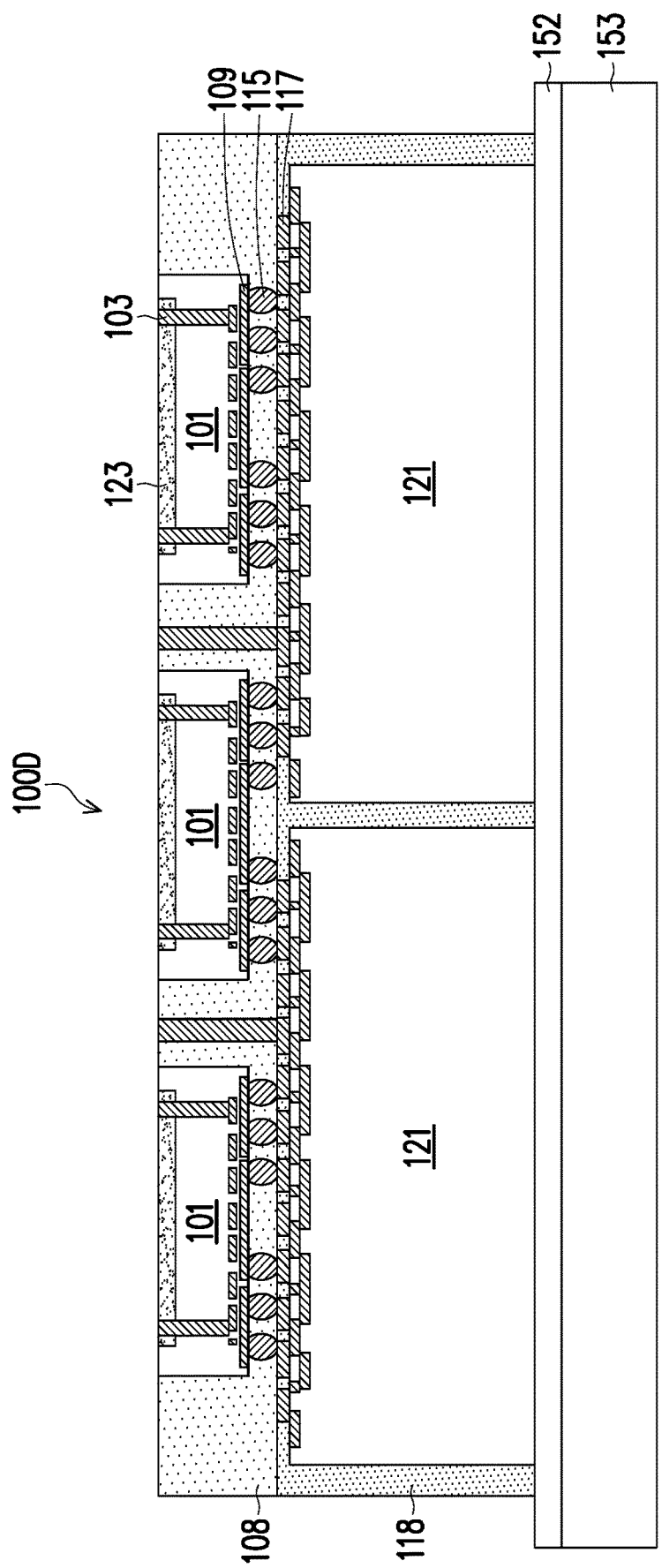

Next, in FIG. 16, the material 123 is formed in the substrates 101 around (e.g., contacting) the sidewalls of the through vias 103. The processing illustrated in FIGS. 6-7 may be performed to form the material 123, in some embodiments. After being formed, the material 123, the through vias 103, the substrates 101, and the molding material 108 have a coplanar upper surface.

Figure 17:
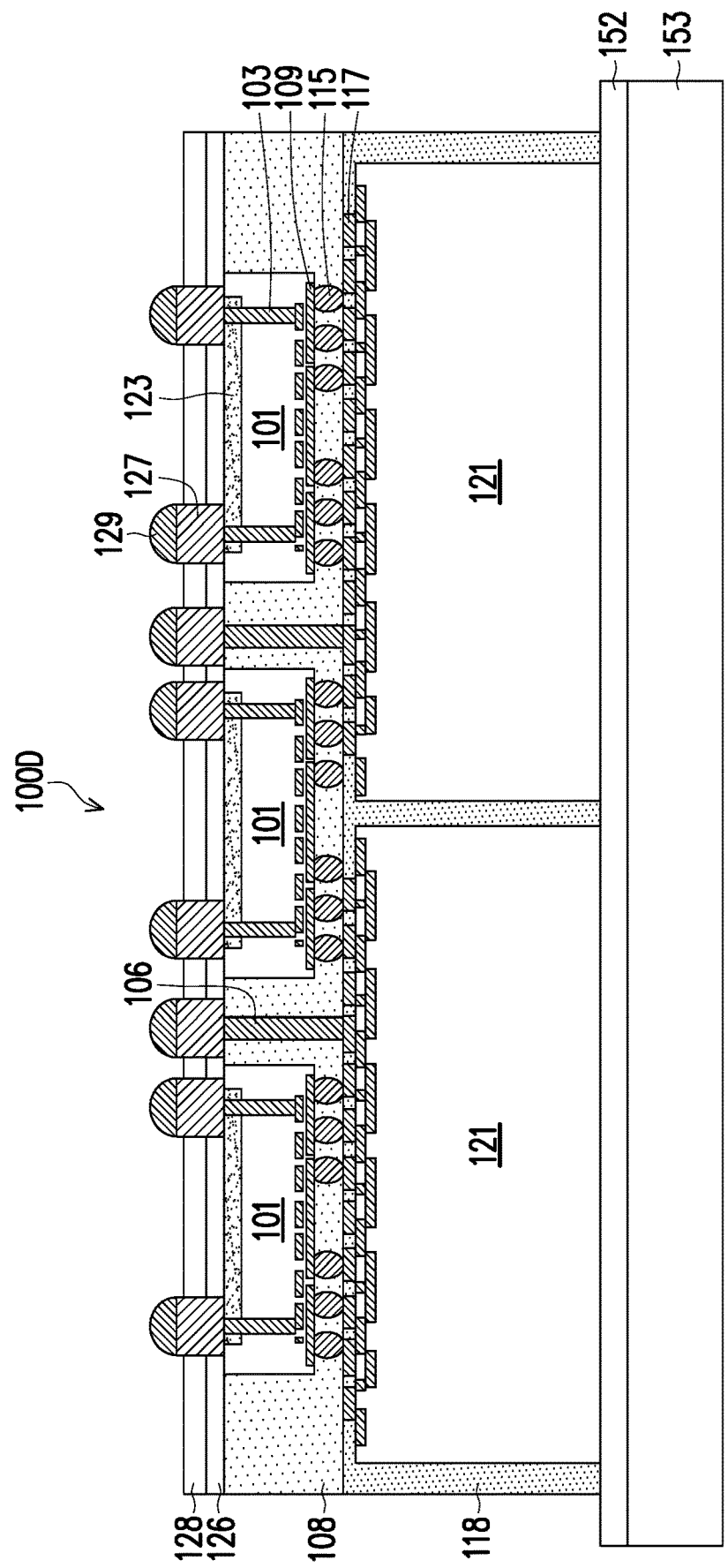

Next, in FIG. 17, the redistribution structure 126, which is optional, is formed over the molding material 108. Next, the polymer layer 128 is formed over the molding material 108 and over the redistribution structure 126 (if formed). External connectors 127 are formed which extend through the polymer layer 128 and are electrically coupled to the through vias 103. Solder regions 129 may be formed on top of the external connectors 127.

Figure 18:
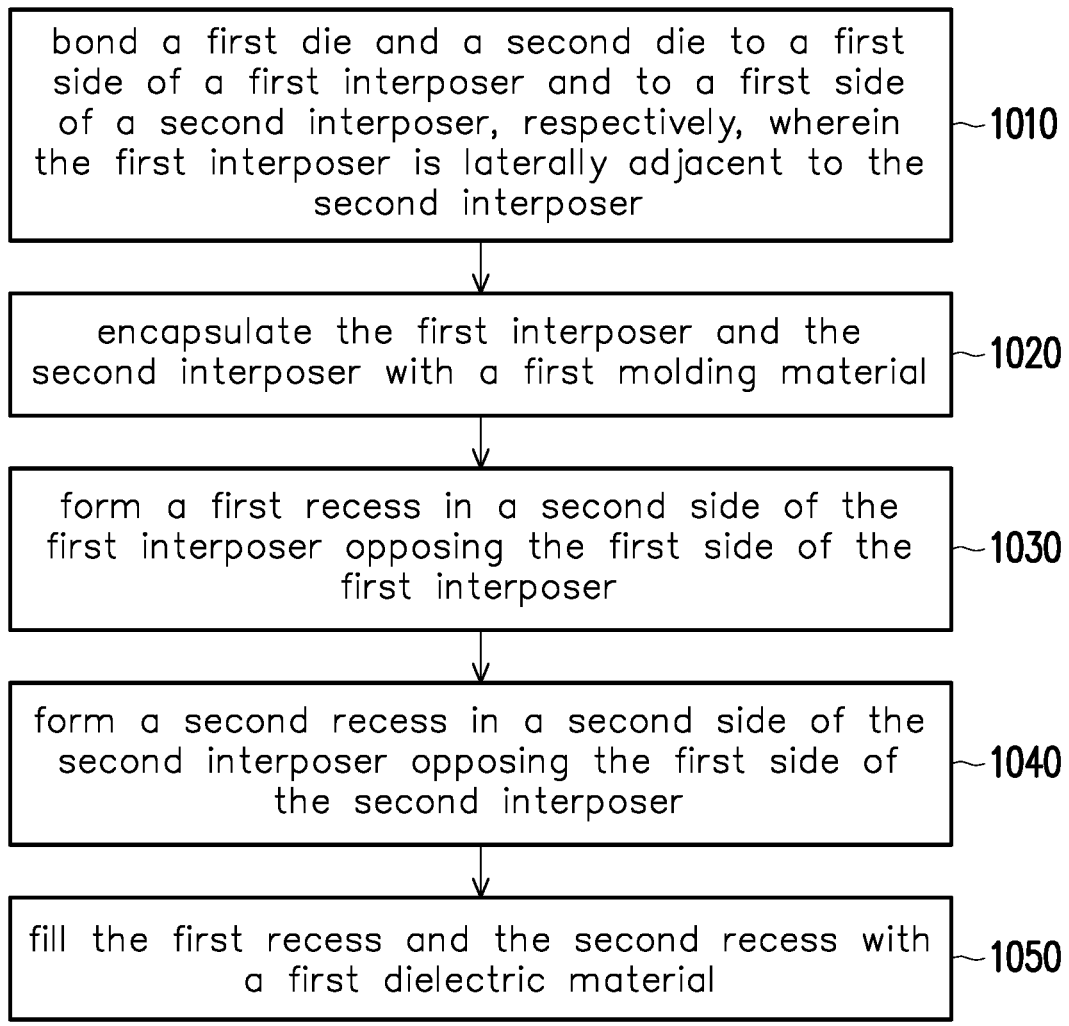
FIG. 18 illustrates a flow chart of a method of forming a semiconductor structure, in some embodiments.

FIG. 18 illustrates a flow chart of a method 1000 of forming a semiconductor device, in some embodiments. It should be understood that the embodiment method shown in FIG. 18 is merely an example of many possible embodiment methods. One of ordinary skill in the art would recognize many variations, alternatives, and modifications. For example, various processing blocks as illustrated in FIG. 18 may be added, removed, replaced, rearranged and repeated.

Referring to FIG. 18, at block 1010, a first die and a second die are bonded to a first side of a first interposer and to a first side of a second interposer, respectively, wherein the first interposer is laterally adjacent to the second interposer. At block 1020, the first interposer and the second interposer are encapsulated with a first molding material. At block 1030, a first recess is formed in a second side of the first interposer opposing the first side of the first interposer. At block 1040, a second recess is formed in a second side of the second interposer opposing the first side of the second interposer. At block 1050, the first recess and the second recess are filled with a first dielectric material.

In accordance with an embodiment, a method of forming a semiconductor structure includes bonding a first die and a second die to a first side of a first interposer and to a first side of a second interposer, respectively, where the first interposer is laterally adjacent to the second interposer; encapsulating the first interposer and the second interposer with a first molding material; forming a first recess in a second side of the first interposer opposing the first side of the first interposer; forming a second recess in a second side of the second interposer opposing the first side of the second interposer; and filling the first recess and the second recess with a first dielectric material. In an embodiment, the method further includes before bonding the first die and the second die, attaching the first interposer and the second interposer to a carrier. In an embodiment, the method further includes after bonding the first die and the second die, encapsulating the first die and the second die with a second molding material. In an embodiment, the method further includes filling a gap between the first die and the second die with an underfill material. In an embodiment, the method further includes before bonding the first die and the second die, attaching the first die and the second die to a carrier. In an embodiment, the first molding material further encapsulates the first die and the second die. In an embodiment, the method further includes encapsulating the first die and the second die with a second molding material. In an embodiment, the method further includes forming a through via in the first molding material. In an embodiment, the first dielectric material is a polymer. In an embodiment, the method further includes forming a conductive connector on the first dielectric material, wherein the conductive connector is electrically coupled to a first conductive pillar in the first interposer.

In accordance with an embodiment, a method of forming a semiconductor structure includes: attaching a first die and a second die to a first interposer and a second interposer, respectively, wherein after the attaching, the first die is laterally adjacent to the second die, and the first interposer is laterally adjacent to the second interposer; surrounding the first interposer and the second interposer with a first molding material; forming a first recess in a first surface of the first interposer distal from the first die; forming a second recess in a first surface of the second interposer distal from the second die; and filling the first recess and the second recess with a polymer layer. In an embodiment, a surface of the polymer layer distal from the first die is level with the first surface of the first interposer and the first surface of the second interposer. In an embodiment, wherein forming the first recess comprises: forming a patterned mask layer on the first surface of the first interposer, wherein the pattered mask layer covers the first molding material, covers a first portion of the first interposer contacting the first molding material, and exposes a second portion of the first interposer; and performing an anisotropic etching process to remove an exterior layer of the second portion of the first interposer. In an embodiment, a width of the first recess is formed to be smaller than a width of the first interposer such that sidewalls of the first recess are spaced apart from respective sidewalls of the first interposer contacting the first molding material. In an embodiment, the first interposer comprises a first substrate and a first through-substrate via (TSV) in the first substrate, wherein after forming the first recess, the first TSV extends into the first recess.

In accordance with an embodiment, a semiconductor structure includes: a plurality of interposers laterally adjacent to each other and having through-substrate vias (TSVs); a first molding material around the plurality of interposers; at least one die bonded and electrically connect to at least one of the plurality of interposers; and a dielectric layer in backsides of the plurality of interposers facing away from the at least one die. In an embodiment, the semiconductor structure further includes: a second molding material around the at least one die; and an underfill material between the plurality of interposers and the at least one die. In an embodiment, the first molding material surrounds the at least one die. In an embodiment, the semiconductor structure further includes a through via in the first molding material, wherein the through via is electrically connected to the at least one die. In an embodiment, the dielectric layer is a polymer layer, wherein the semiconductor structure further comprises external connectors on the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
bonding a first die and a second die to a first side of a first interposer and to a first side of a second interposer, respectively, wherein the first interposer is laterally adjacent to the second interposer;
encapsulating the first interposer and the second interposer with a first molding material;

forming a first recess in a second side of the first interposer opposing the first side of the first interposer, wherein a bottom of the first recess is between the first side of the first interposer and the second side of the first interposer, wherein the bottom of the first recess exposes a first surface of a first substrate of the first interposer;
forming a second recess in a second side of the second interposer opposing the first side of the second interposer; and
filling the first recess and the second recess with a first dielectric material, wherein the first dielectric material contacts and extends along the first surface of the first substrate.

2. The method of claim 1, further comprising, before bonding the first die and the second die, attaching the first interposer and the second interposer to a carrier.

3. The method of claim 2, further comprising, after bonding the first die and the second die, encapsulating the first die and the second die with a second molding material.

4. The method of claim 3, further comprising filling a gap between the first die and the second die with an underfill material.

5. The method of claim 1, further comprising, before bonding the first die and the second die, attaching the first die and the second die to a carrier.

6. The method of claim 5, wherein the first molding material further encapsulates the first die and the second die.

7. The method of claim 5, further comprising encapsulating the first die and the second die with a second molding material.

8. The method of claim 5, further comprising forming a through via in the first molding material.

9. The method of claim 1, wherein the first dielectric material is a polymer.

10. The method of claim 9, wherein the method further comprises forming a conductive connector on the first dielectric material, wherein the conductive connector is electrically coupled to a first conductive pillar in the first interposer.

11. The method of claim 1, wherein the first interposer comprises a first through-substrate via (TSV) in the first substrate, wherein after forming the first recess, the first TSV extends into the first recess.

12. A method of forming a semiconductor structure, the method comprising:
attaching a first die and a second die to a first interposer and a second interposer, respectively, wherein after the attaching, the first die is laterally adjacent to the second die, and the first interposer is laterally adjacent to the second interposer, wherein the first interposer comprises a first substrate and a first through-substrate via (TSV) in the first substrate;
surrounding the first interposer and the second interposer with a first molding material;
forming a first recess in a first surface of the first interposer distal from the first die, wherein after forming the first recess, the first TSV extends into the first recess;
forming a second recess in a first surface of the second interposer distal from the second die; and
filling the first recess and the second recess with a polymer layer.

13. The method of claim 12, wherein a surface of the polymer layer distal from the first die is level with the first surface of the first interposer and the first surface of the second interposer.

14. The method of claim 12, wherein forming the first recess comprises:
forming a patterned mask layer on the first surface of the first interposer, wherein the pattered mask layer covers the first molding material, covers a first portion of the first interposer contacting the first molding material, and exposes a second portion of the first interposer; and
performing an anisotropic etching process to remove an exterior layer of the second portion of the first interposer.

15. The method of claim 14, wherein a width of the first recess is formed to be smaller than a width of the first interposer such that sidewalls of the first recess are spaced apart from respective sidewalls of the first interposer contacting the first molding material.

16. A method of forming a semiconductor structure, the method comprising:
embedding a first interposer and a second interposer laterally adjacent to the first interposer in a first molding material, wherein the first interposer has a first through-substrate via (TSV), wherein a first end surface of the first TSV is between a first side of the first interposer and a second opposing side of the first interposer;
forming a redistribution structure over the first molding material at the first side of the first interposer, wherein the redistribution structure extends continuously from the first interposer to the second interposer;
attaching a first die to the redistribution structure at the first side of the first interposer;
thinning the first interposer from the second side of the first interposer to expose the first end surface of the first TSV;
after thinning the first interposer, forming a first recess at the second side of the first interposer by removing a first portion of a substrate of the first interposer contacting the first TSV, wherein the first recess exposes sidewalls of the first TSV; and
filling the first recess with a dielectric material.

17. The method of claim 16, wherein thinning the first interposer comprises performing a planarization process from the second side of the first interposer, wherein after thinning the first interposer and before forming the first recess, the first end surface of the first TSV is level with a first surface of the first molding material.

18. The method of claim 17, where forming the first recess comprises:
forming a patterned mask layer on the second side of the first interposer, wherein the patterned mask layer exposes the first portion of the substrate of the first interposer contacting the first TSV while covering a second portion of the substrate away from the first TSV; and
performing an anisotropic etching process to remove the exposed first portion of the substrate, wherein the second portion of the substrate remain after the anisotropic etching process, wherein the first TSV extends into the first recess.

19. The method of claim 16, wherein filling the first recess comprises filling the first recess with a polymer material, wherein an upper surface of the polymer material distal from the first die is level with a first surface of the first molding material distal from the first die.

20. The method of claim 16, further comprising embedding the first die in a second molding material, wherein a first width of the first molding material is larger than a second width of the second molding material, such that a first sidewall of the first molding material is vertically aligned with a first sidewall of the second molding material, and a second sidewall of the second molding material is disposed laterally between the first sidewall of the first molding material and a second sidewall of the first molding material.

* * * * *